(12) United States Patent
Furukawa et al.

(10) Patent No.: US 8,026,513 B2
(45) Date of Patent: Sep. 27, 2011

(54) BOTTOM EMISSION TYPE ORGANIC ELECTROLUMINESCENT PANEL

(75) Inventors: Keiichi Furukawa, Tokyo (JP); Nobuhiko Takashima, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 634 days.

(21) Appl. No.: 12/159,126

(22) PCT Filed: Dec. 8, 2006

(86) PCT No.: PCT/JP2006/324531
§ 371 (c)(1), (2), (4) Date: Jun. 25, 2008

(87) PCT Pub. No.: WO2007/077715
PCT Pub. Date: Jul. 12, 2007

(65) Prior Publication Data
US 2010/0219398 A1    Sep. 2, 2010

(30) Foreign Application Priority Data
Jan. 5, 2006  (JP) .................................. 2006-000471

(51) Int. Cl.
*H01L 51/50* (2006.01)
(52) U.S. Cl. .................... 257/40; 257/79; 257/E51.018; 257/E51.022
(58) Field of Classification Search ............ 257/40, 257/79–103, E51.018, E51.019, E51.02, 257/E51.021, E51.022; 438/22–47
See application file for complete search history.

(56) References Cited

U.S. PATENT DOCUMENTS

| | | | | |
|---|---|---|---|---|
| 6,160,346 A * | 12/2000 | Vleggaar et al. | ............... | 313/512 |
| 6,420,200 B1 * | 7/2002 | Yamazaki et al. | ............... | 438/30 |
| 6,452,218 B1 * | 9/2002 | Cao | ................. | 257/103 |
| 6,905,907 B2 * | 6/2005 | Konuma | ......................... | 438/99 |
| 6,977,463 B2 * | 12/2005 | Sato | ................. | 313/498 |
| 2004/0241931 A1 * | 12/2004 | Akimoto et al. | ............... | 438/220 |
| 2005/0095736 A1 * | 5/2005 | Padiyath et al. | ................. | 438/22 |
| 2005/0156519 A1 * | 7/2005 | Yoshizawa et al. | ............ | 313/512 |
| 2005/0189535 A1 * | 9/2005 | Hsueh et al. | ...................... | 257/40 |
| 2006/0231844 A1 * | 10/2006 | Carter | .............................. | 257/79 |
| 2007/0221910 A1 * | 9/2007 | Bechtel et al. | .................. | 257/40 |

\* cited by examiner

*Primary Examiner* — Kiesha Bryant
*Assistant Examiner* — Eric Ward
(74) *Attorney, Agent, or Firm* — Lucas & Mercanti, LLP

(57) ABSTRACT

Provided is a bottom emission type organic EL panel capable of preventing or delaying loss of light emission from an end portion of the light emission area and reduction of the light emission area in an organic EL element. This organic electro luminescence panel includes an organic electro luminescence element having at least one organic layer between an anode and a cathode arranged on a substrate. This panel has a main light emission area emitting light with a high luminance and a non-light emission area or a low light emission area emitting light with a lower luminance than the main light emission area, arranged outside the end portion of the main light emission area. By limiting the main light emission area to a smaller size than the cathode forming area, the end portion of the cathode forming area is arranged outside the end portion of the main light emission area.

2 Claims, 7 Drawing Sheets

BOTTOM EMISSION TYPE ORGANIC ELECTROLUMINESCENT PANEL

This is a U.S. National Phase Application under 35 U.S.C. 371 of International Application PCT/JP2006/324531 filed on Dec. 8, 2006.

This Application claims the priority of Japanese Application No. 2006-000471, filed Jan. 5, 2006, the entire content of which is hereby incorporated by reference.

TECHNICAL FIELD

The present invention relates to a bottom emission type organic electroluminescent panel which is utilized for a flat light source and a display.

BACKGROUND ART

In recent years, an organic electroluminescent element (hereinafter, also referred to as an organic EL element) has been extensively developed. An organic EL element is a thin film element comprising at least one layer of an organic layer (including an emission layer) being sandwiched by electrode thin films, and applications thereof for various displays, which are capable of obtaining emission colors from red to blue by forming the organic layer with (appropriate) selection among fluorescent substances of various organic low molecular weigh compounds and polymer compounds, have been studied.

A bottom emission type organic EL element is constituted of, for example, transparent conductive film such as ITO film having being patterned as a bottom electrode on a transparent substrate, an organic layer containing an emission layer in addition to cathode as a reflective electrode which are accumulated on said anode, and emission is taken out from the substrate side.

FIG. 1 is a drawing to show an example of a bottom emission type organic EL element of a simple matrix type. In a simple matrix type, ITO (indium tin oxide) film is patterned into a stripe form to form transparent electrode (anode) 2, organic layer 3 having been further provided, and then cathode 4 (also referred to as a reflective electrode) comprising such as aluminum is formed also in a stripe form so as to cross straight against the transparent electrode pattern (herein, this cathode layer is abbreviated in FIG. 1 (a) because it is formed covering the whole surface).

In these elements, an overlapping portion of an anode and a cathode forms an emission area, however, it has been proved that there caused a phenomenon to lose emission in the edge portion of a cathode in an emission area when light-on or current-on is continued for a long period resulting in reduction of the light emission area (the region is 15 in FIGS. 1 (a) and (b)). This is considered to be related to a cathode (a reflective electrode) being present on the outside (the atmospheric side).

This invention provides a bottom emission type organic EL panel in which arrangement of electrodes constituting said panel is designed to prevent or restrain reduction of the aforesaid emission area. Herein, it is disclosed that improvement is intended by conducting sealing of an organic EL by a cathode having an increased film thickness (for example, refer to patent document 1). However, in this document, it is sealing of an active matrix organic EL panel, which is a relationship between organic film and cathode film, and is different from relationship between an emission area and a cathode area according to this invention. An only specific means disclosed to avoid contact of a cathode and a wiring, which is caused by forming a cathode having a larger size than organic film, is a means by a sealing material. Further, since a cathode layer thickness is increased, it is expected to cause a problem of such as stress in an emitting substance having a relatively large area in this invention.

Further, it is known an example of a segment emission organic EL element of a bottom emission type in which thin film comprising a metal, which is provided with a work function of not more than 4.8 eV such as aluminum, is arranged around an ITO electrode in a similar manner to this invention (for example, refer to patent document 2), however, the purpose is different from this invention.

Further, disclosed is a constitution to make an emission area to be smaller than cathode area by use of such as an insulation film or a supplemental electrode (for example, refer to patent documents 3 and 4). However, this invention proposes a method not only to make an emission area smaller than a cathode area but also to make a primary emission area smaller than a cathode area to form a constitution, in which a low emission area and a cathode area are brought in contact to reduce an effect of loss. Simultaneously, a means to make a main emission area smaller than cathode area is also different.

Patent Document 1: JP-A 2003-178885 (hereinafter, JP-A refers to Japanese Patent Publication Open to Public Inspection)
Patent Document 2: JP-A 2000-357589
Patent Document 3: JP-A 2001-267066
Patent Document 4: JP-A 2000-21564

DISCLOSURE OF THE INVENTION

Problems to be Solved by the Invention

An object of this invention is to provide an organic electroluminescent panel equipped with bottom emission type organic electroluminescent element (organic EL element), wherein reduction of an emission area due to loss of emission from the edge portion of the emission area of said element is prevented or delayed.

Means to Solve the Problems

The above-described object of this invention has been achieved by following constitutions 1-7.

1. A bottom emission type organic electroluminescent panel equipped with an electroluminescent element having an anode and a cathode on a substrate and at least one organic layer between said anode and said cathode, wherein a main emission area emitting light with a high luminance and a non-emission area or an emission area emitting light with a relatively lower luminance, which are arranged outside the edge portion of said main emission area, are provided, and the edge portion of the aforesaid cathode area is arranged outside the edge portion of the aforesaid main light emission area by limiting the main emission area to a smaller size than the cathode forming area.

2. The bottom emission type organic electroluminescent panel described in item 1, wherein an anode take-out part is arranged on the back surface of a substrate equipped with the aforesaid anode, and said anode take-out part is electrically connected with the aforesaid anode through a through hole arranged on said substrate.

3. The bottom emission type organic electroluminescent panel described in item 1, wherein at least a part of the aforesaid anode is prolonged to the outer direction as an anode take-out, part, an area provided with an organic layer having a layer thickness larger than the area, on which other organic layer is formed, being present so as to overlap on said anode take-out part, and a part of a cathode layer is formed so as to overlap on at least a part of the aforesaid area on which a thick organic layer is formed.

4. The bottom emission type organic electroluminescent panel described in item 1, wherein at least one electron injection layer is arranged as a constituent layer of the aforesaid organic layer and the forming area of said electron injection layer is limited to be narrower than the cathode forming area.

5. The bottom emission type organic electroluminescent panel described in item 1, wherein the aforesaid anode is provided with an area having been subjected to a surface treatment and an edge portion of a cathode forming area is arranged outside of said area.

6. The bottom emission type organic electroluminescent panel described in item 5, wherein the aforesaid surface treatment has been conducted via a treatment process including at least a plasma treatment.

7. The bottom emission type organic electroluminescent panel described in any one of items 1-6 is characterized by white emission.

EFFECTS OF THE INVENTION

This invention has enabled to provide an organic electroluminescent panel equipped with bottom emission type organic electroluminescent element (organic EL element), wherein reduction of an emission area due to loss of emission from the edge portion of the emission area of said element is prevented or delayed.

DESCRIPTION OF THE SYMBOLS

Figure 1:
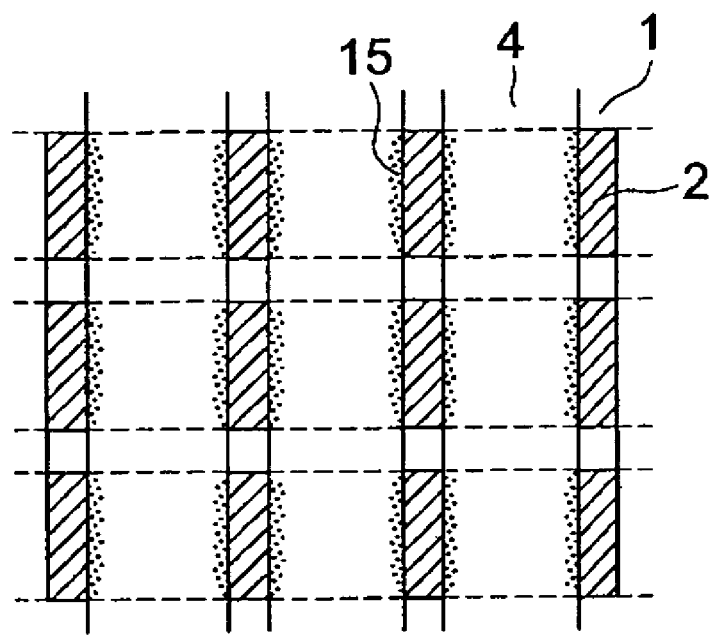
FIG. 1 is a schematic drawing to show an example of a bottom emission type organic EL element of a simple matrix type.
Figure 1:
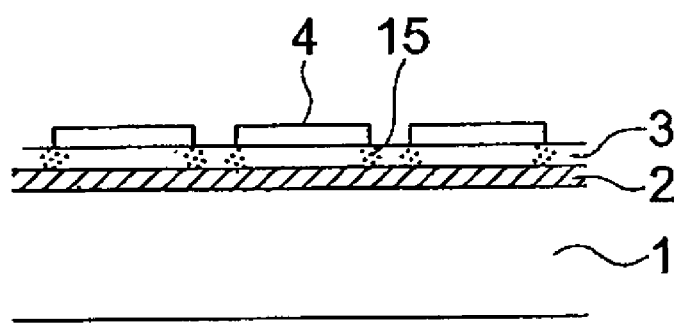

1: substrate (support)
2: anode (transparent electrode)
2b: region having been subjected to surface treatment on anode 2
3: organic layer (organic compound layer)
3a: organic layer having layer thickness different from organic layer 3
3b: electron injection layer
4: cathode (reflective electrode)
5: through hole
6: cathode take-out part
7: anode take-out part
8: main emission area
9: non-emission area
10: low-emission area

PREFERRED EMBODIMENTS TO CARRYOUT THE INVENTION

This invention constitutes a bottom emission type organic electroluminescent panel characterized by arranging the edge portion of the forming surface of the aforesaid cathode outside of the edge portion of the light emitting area.

In an organic EL element of a simple matrix drive type shown in FIG. 1, each of the overlapped portions of an anode and a cathode crossing straight emits light. In the case of a bottom emission type organic EL element in which a transparent electrode (an anode such as ITO)/an organic layer/a reflective electrode (a cathode such as aluminum) are successively formed, reduction of an emission area from the portion defined by the edge of a reflective electrode is a primary portion of the loss. That is, there caused a phenomenon to make the emission area smaller than the reflective electrode width when light-on is continued. On the other hand, there caused no reduction of an emission area along the transparent electrode width direction. This is considered because invasion of moisture or a gas such as oxygen from the outside is prevented due to said portion being covered by a reflective electrode. That is, electric current is flowing in an organic layer including an emission layer sandwiched between electrodes; however, it is considered that an emission function is lowered or destroyed due to change or modification of an organic compound in the organic layer when such as moisture or oxygen invades from the outside in this state.

Therefore, this invention can diminish the portion through which moisture invades by determining an area to emit light (an emission area) as much as possible by the pattern of a transparent electrode (for example, ITO) or other means and forming a reflective electrode (a cathode made of such as aluminum) as a pattern of a larger size than said area.

That is, in a bottom emission type organic EL panel in which a transparent electrode/an organic layer/a reflective electrode are successively formed on a substrate, the portion through which moisture may invade is diminished by determining an emission area as much as possible by ITO as a transparent electrode and forming a reflective electrode in a larger size than said emission area.

Further, it is possible to delay loss of emission area (reduction of an area) by making a reflective electrode larger than the main emission without making said electrode larger than the emission area (the total of a main emission area and a low emission area) when a low emission area which emits light with a relatively low luminance is arranged around a main emission area which emits light with a relatively high luminance.

In the above, reduction of an emission area was explained in reference to an organic EL panel of a simple matrix drive type shown in FIG. 1, however, the above-described way of thinking of this invention can be applied to such as each pixel of not only a simple matrix drive type but also a segment emission type panel such as an organic EL panel utilized as a white light source and an organic EL panel by an active matrix type drive.

In aforesaid patent document 2, in a bottom emission type organic EL element, an organic EL element of a segment display type in which metal thin film having a work function of not more than 4.8 eV (such as aluminum thin film) is arranged outside of the region other than the ITO transparent electrode, is disclosed, however, it is related to an organic EL element of a segment display type in which the metal film is employed not as a reflective electrode but in stead of an insulation film around the emission area by utilizing a function to restrain hole injection; the purpose is different from this invention.

In this invention, the part may be utilized as a take-out electrode and it is important that an anode (a transparent electrode) is utilized to determine an emission area and an area of a cathode (a reflective electrode) is made larger than the transparent electrode to seal an element.

In the following, this invention will be detailed in reference to FIGS. 2-7, taking an organic EL element of a segment emission type as an example.

Figure 2:
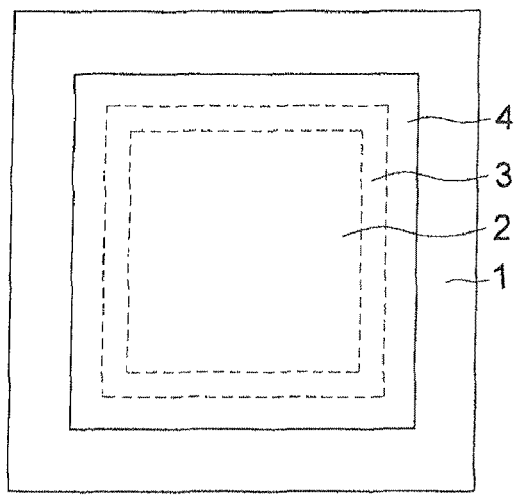
FIG. 2 is a schematic drawing to show an example of an electrode structure of an organic EL panel of this invention.
Figure 2:
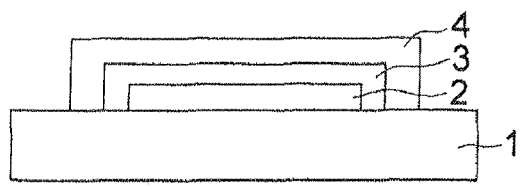
Figure 2:
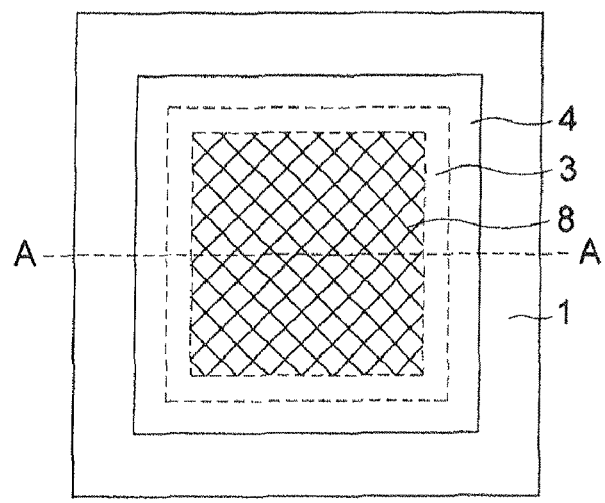
Figure 2:
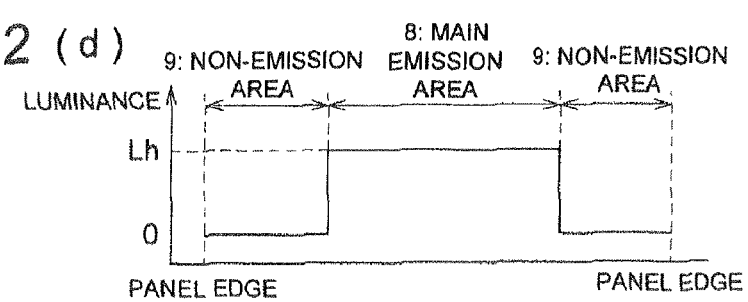

FIG. 2 is a schematic drawing to show an example of an electrode structure of an organic EL panel. A main emission area, a non-emission area and a low emission area utilized here will be explained in reference to FIG. 2 and FIG. 3.

FIG. 2 (a) shows an example of a bottom emission type organic EL panel in which anode 2 (a transparent electrode comprising such as ITO thin film), further, organic layer 3 including such as an emission layer, and cathode 4 (as a material to form a cathode, metal thin film comprising metal having a work function of not more than 4.8 eV such as aluminum is preferably utilized) are successively formed on a substrate (such as glass).

Herein, main emission area 8 is a region where only anode 2 (a transparent electrode), organic layer 3 (including an emission layer) and cathode 4 (a reflective electrode) are overlapped. That is, it corresponds to the area of anode 2 in FIGS. 2 (a) and a main emission area 8 in FIG. 2 (c). Further, FIG. 2 (b) is a cross-sectional view of FIG. 2 (a). FIG. 2 (c) is a drawing to show a state of organic EL panel emitting light. FIG. 2 (d) is a drawing to show emission luminance along cross section A-A of FIG. 2 (c).

In FIGS. 2 (d), it is clear that an organic EL panel is constituted of an area which emits light with a high luminance (luminance=Lh) and an area which does not emits light (luminance=0). Herein, emission area is only an area which emits light with a high luminance and said area which emits light with a high luminance is a main emission area. An area which does not emit light is a non-emission area.

Figure 3:
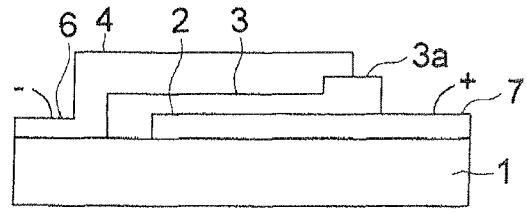
FIG. 3 is a schematic drawing to show an example of an electrode structure of an organic EL panel of this invention.
Figure 3:
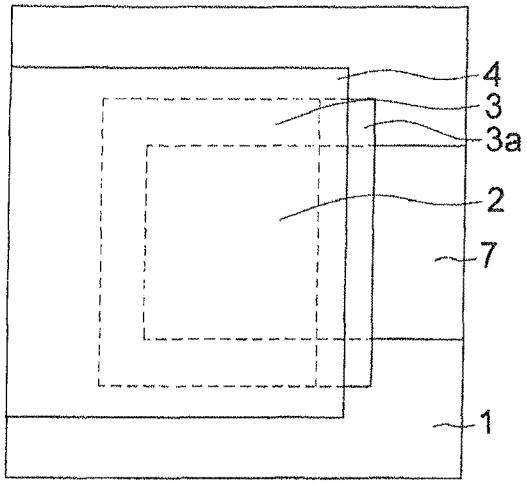
Figure 3:
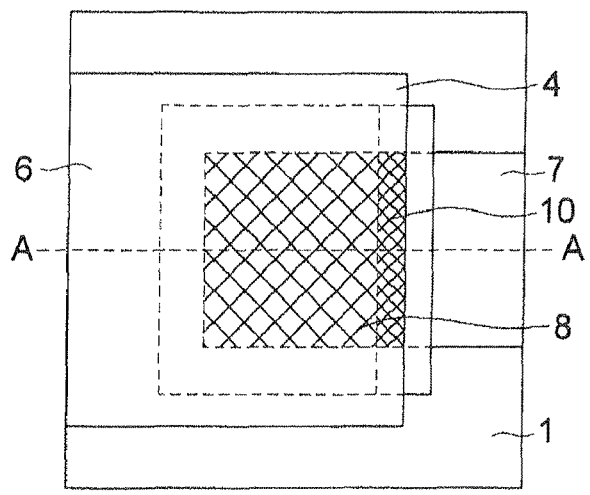
Figure 3:
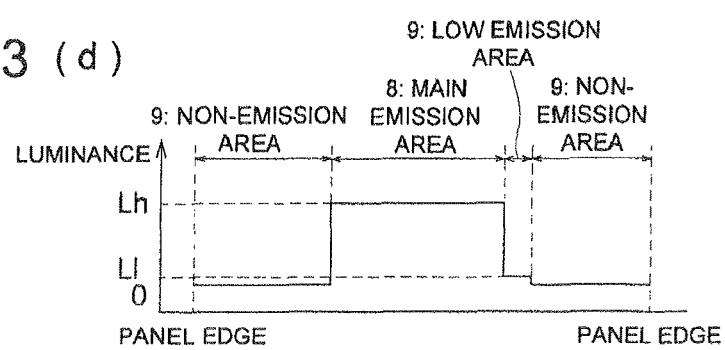

This invention is characterized in that the edge portion of the aforesaid forming surface of a cathode is arranged outside of the edge portion of an emission area; however, it is preferable that the forming area of cathode 4 is larger than the emission area and a distance from an arbitrarily selectable edge portion of the forming area of cathode 4 to the nearest edge portion of said emission area is not less than 200 μm. This design is effective to prevent invasion of such as moisture into a main emission area from the outer atmosphere, and is essentially possible to prevent or delay reduction of an emission area due to loss of light emission from the edge of a main emission area. FIG. 3 shows another example of an organic EL panel of this invention. FIG. 3 (a) is from a drawing of an example of a bottom emission type EL panel in which anode 2 (a transparent electrode comprising such as ITO thin film), organic layer 3 including such as an emission layer and cathode 4 are successively formed on substrate (such as glass) observed from the viewing surface.

Further, FIG. 3 (b) is a drawing to show a cross-section of FIG. 3 (a). FIG. 3 (c) is a drawing to show a state of an organic EL panel of FIG. 3 (a) emitting light. FIG. 3 (d) is a drawing to show emission luminance along A-A cross-section of FIG. 3 (c).

In FIGS. 3 (d), it is clear that an organic EL panel is constituted of an area which emits light with a high luminance (luminance=Lh), an area which emits light with a low luminance (luminance=L1) and an area which does not emits light (luminance=0). Herein, emission area is constituted of an area which emits light with a high luminance and an area which emits light with a low luminance. Said area which emits light with a high luminance is a main emission area and said area which emits light with a low luminance is a low emission area. An area which does not emit light is a non-emission area. Herein, a low luminance indicates a luminance relatively lower than a high luminance.

Herein, an emission area is an area which is emitting light regardless to luminance and includes the both of a main emission area and a low emission area.

Figure 4:
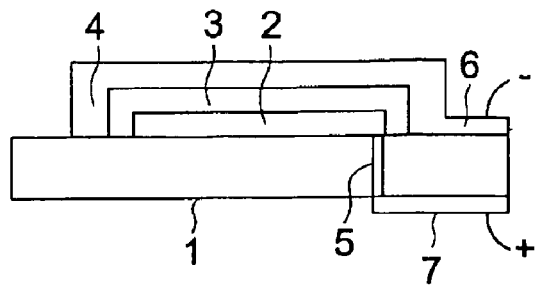
FIG. 4 is a schematic drawing to show an example of an electrode structure of an organic EL panel of this invention.
Figure 5:
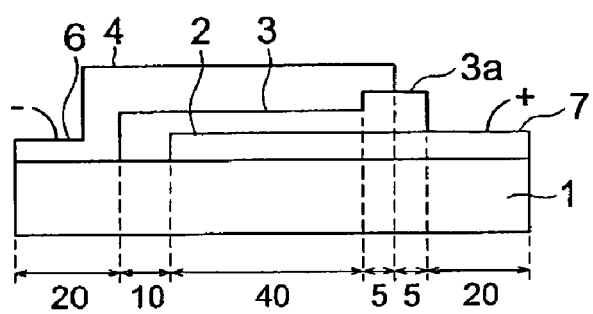
FIG. 5 is a schematic drawing to show an example of an electrode structure of an organic EL panel of this invention.
Figure 5:
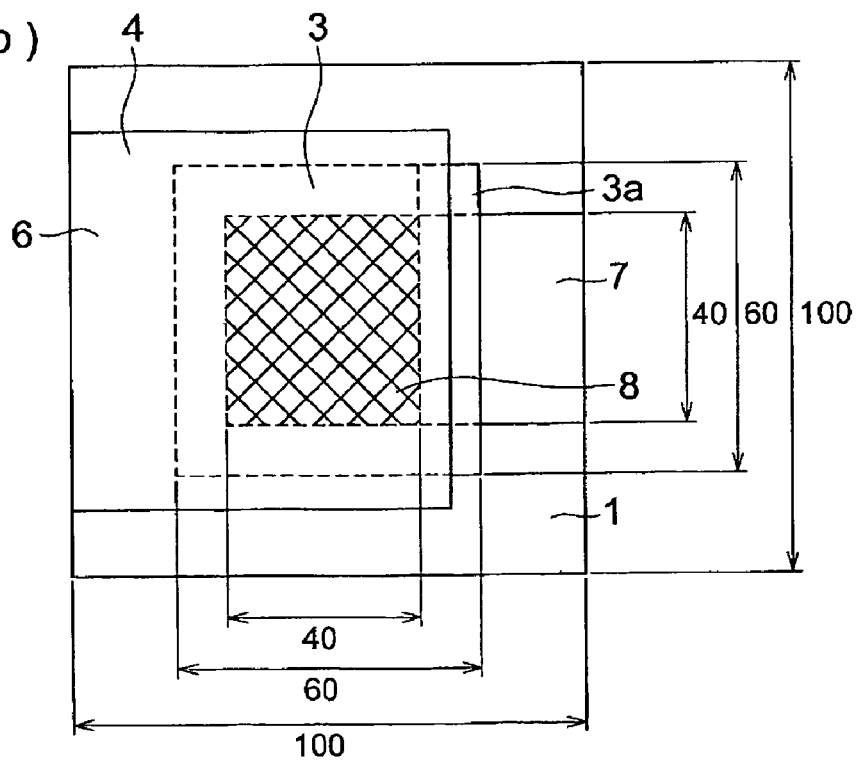

FIG. 4 is a schematic drawing of an example of an electrode structure of an organic EL panel of this invention, and is characterized in that anode take-out portion 7 is arranged on the light take-out surface side which is a back surface of substrate 1 provided with anode 2, and said anode take-out portion 7 is electrically connected with aforesaid anode 2 via through hole 5 arranged on said substrate 1. Further, a part of cathode 4 arranged on the back surface of substrate 1, on which the aforesaid anode take-out portion 7 is arranged, (also referred to as the light take-out surface side) is utilized as cathode take-out portion 6. This design enables to assure anode take-out portion even when a cathode area is made larger than an emission area. In this case, there is no low emission area and a main emission area is identical with an emission area. FIG. 5 is also a schematic drawing to show an example of an electrode structure of an organic EL panel of this invention; FIG. 5 (a) is a schematic cross-sectional view of an organic EL panel of this invention; FIG. 5 (b) shows an electrode structure of an organic EL panel of this invention as a view from light take-out surface side (also referred to as the back surface side of cathode 4 (the cathode forming surface)) of the organic EL panel. FIG. 5 shows an example of a bottom emission type organic electroluminescent panel having a form, in which organic layer 3 and organic layer 3a having a different layer thickness from each other are successively formed on anode 2, an uncovered portion of which is provided as anode take-out area 7. Organic layer 3a is arranged so as to have a larger thickness than organic layer 3. In the case that the difference of thickness between organic layers is large, area 3 having a large thickness does not emit light. In this case, it is possible to assure an anode take-out portion while making a cathode area larger than an emission area. In this case, there is no low emission area and a main emission area is identical with an emission area.

When the difference of thickness between organic layers is small, area 3a where organic layer has a large thickness emits light with a low luminance. In this case, the edge portion of a cathode area is emitting light; however, a rate of loss which proceeds from the edge portion of an emission area becomes slow due to the low luminance. In this case, a main emission area does not contact with the edge portion of a cathode area and a low emission area contacts with the edge portion of a cathode area.

Figure 6:
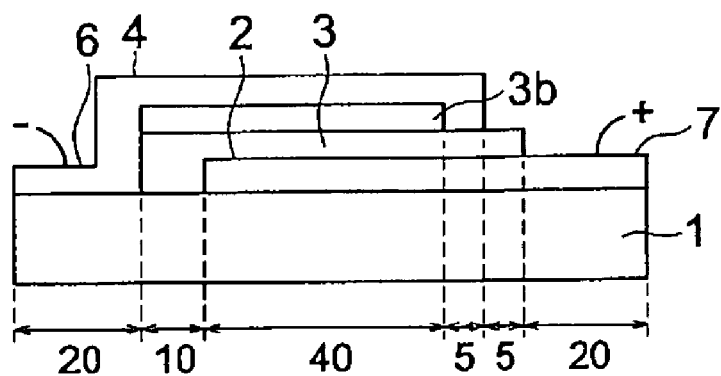
FIG. 6 is a schematic drawing to show an example of an electrode structure of an organic EL panel of this invention.
Figure 6:
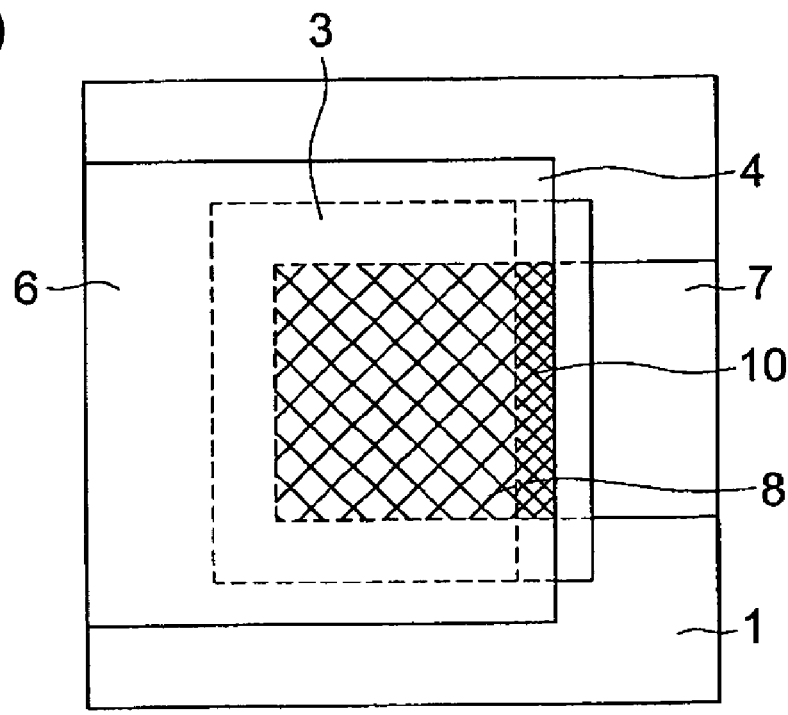

FIG. 6 is also a schematic drawing to show an example of an electrode structure of an organic EL panel of this invention, and show a bottom emission type organic electroluminescent panel having a form which at least one electron injection layer 3b is arranged as a constituent layer of organic layer 3, and a forming area of said electron injection layer 3b is set to narrower than the forming area of cathode 4.

An area where an electron injection layer is not provided does not emit light or emits with a low luminance due to difference of an electron injection characteristic between an area where an electron injection layer is not provided and an area where an electron injection layer is provided. When the difference of an electron injection characteristic is large, an area where an electron injection layer is not provided does not emit light and forms a non-emission area. It is possible to assure anode take-out portion 7 while making a cathode forming area larger than an emission area because an electron injection layer is set to be narrower than a cathode forming area.

Figure 7:
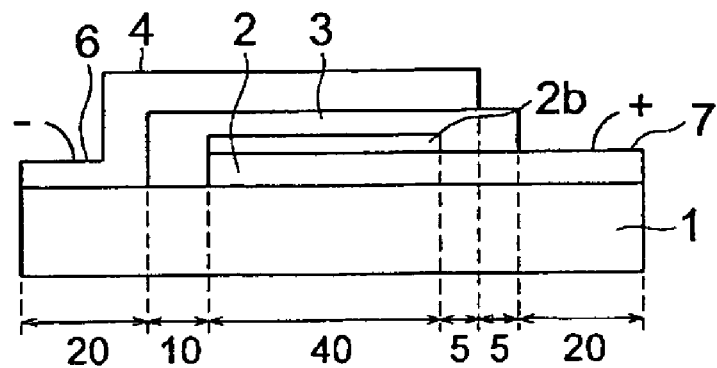
FIG. 7 is a schematic drawing to show an example of an electrode structure of an organic EL panel of this invention.
Figure 7:
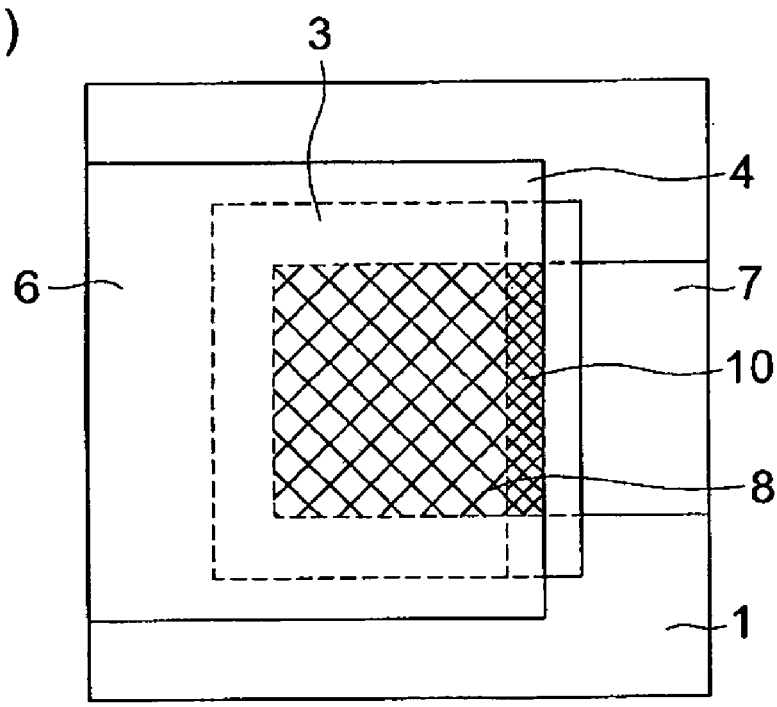

FIG. 7 is also a schematic drawing to show an example of an electrode structure of an organic EL panel of this invention, and shows a bottom emission type organic electroluminescent panel having a form in which anode 2 is provided with area 2b having been subjected to a surface treatment and the edge portion of a forming surface of cathode 4 is formed outside said area 2b having been subjected to a surface treatment.

An area without a surface treatment does not emit light or emits with a low luminance. When the difference of a hole injection ability between an area with a surface treatment and an area without a surface treatment is large, an area without a surface treatment does not emit light and forms a non-emission area. It is possible to assure anode take-out portion 7 while making a cathode forming area larger than an emission area because an area with a surface treatment is set to be narrower than a cathode forming area. When the difference of a hole injection ability between an area with surface treatment and an area without surface treatment is small, an area without a surface treatment forms low emission area 10 which emits light with a low luminance (FIG. 7 (b)).

It is possible to assure anode take-out portion 7 while making a cathode forming area 4 larger than a main emission area 8 because area 2b with a surface treatment is set to be narrower than a cathode area. Herein, a surface treatment indicates a treatment to accompany washing and modification action of the anode surface and to improve a hole injection ability from an anode. Listed are a plasma treatment by such as oxygen and argon, an UV ozone treatment and an excimer irradiation treatment, however, it is not limited thereto provided being accompanied with the aforesaid effect.

In the above, this invention has been explained in reference to an organic EL panel of a segment display type having a rectangular emission area form, however, is not dependent on a form of an emission area.

As described above, since a main emission area is almost determined by an area where a transparent electrode is formed or by other means and not determined by a cathode forming area, reduction of an emission area is not caused in almost of the circumference of an emission area. In the case that a low emission area being determined by a cathode area, loss of an emission area (reduction of the area) from the edge of a low emission area occurs, however, the loss speed is small compared to loss of an emission area from the edge of a main emission area which is caused in the case of a main emission area being determined by a cathode forming area.

In this invention, a cathode (a reflective electrode) functions as a sealing layer to prevent invasion of moisture or oxygen into an organic layer and prevents invasion thereof from the outer atmosphere. Even in the case of sealing these elements with other sealing material (such as a sealing can and anti-moisture film), since it is essentially difficult to conduct complete sealing, an effect of this invention does not change although life time is totally prolonged.

In FIGS. 2-7, organic EL panel of this invention was explained in reference to an organic EL panel of a segment display type as an example, however, is preferably applied in a panel of a segment emission type and is useful for an organic EL panel utilized as a white light source.

However, in addition to this, it can be preferably utilized in each pixel of an organic EL panel of a simple matrix drive type and an organic EL element of an active matrix drive type.

In the following, an organic EL element according to an organic electroluminescent panel (hereinafter, also referred to as an organic EL panel) of this invention will be explained.

<Organic EL Element>

Next, constituent layers of an organic EL panel according to this invention will be detailed. A bottom emission type organic EL panel of this invention, in which light is taken out from the substrate side, is constituted by arranging a transparent electrode on a substrate as an anode and sandwiching organic layers, which are successively formed as follows, between said anode and a cathode as a reflective electrode.

1. anode (transparent electrode)/emission layer/electron transport layer/cathode (reflective electrode),
2. anode (transparent electrode)/positive hole transport layer/emission layer/electron transport layer/cathode (reflective electrode),
3. anode (transparent electrode)/positive hole transport layer/emission layer/positive hole inhibition layer/electron transport layer/cathode (reflective electrode),
4. anode (transparent electrode)/positive hole transport layer/emission layer/positive hole inhibition layer/electron transport layer/cathode buffer layer/cathode (reflective electrode),
5 anode/anode buffer layer/electron inhibition layer/emission layer/positive hole inhibition layer/electron transport layer/cathode.

<Anode>

As an anode according to an organic EL element of this invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. When emission is taken out of this anode, the transmittance is preferably set to not less than 10% and the sheet resistance as an anode is preferably not more than a few hundreds Ω/□. In case of bottom emission type organic EL element, emitted light is taken from anode. Therefore, transmittance is preferably 10% or more, and indium tin oxide (ITO) is most preferred. Further, although the layer thickness depends on a material, it is generally selected in a range of 10-1,000 nm and preferably of 10-200 nm.

<Cathode>

On the other hand, as a cathode according to this invention, metal, alloy, a conductive compound and a mixture thereof, which have a small work function (not more than 4 eV), are Utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. Further, the sheet resistance as a cathode is preferably not more than a few hundreds Ω/□ and the layer thickness is generally selected in a range of 10-1,000 nm and preferably of 50-200 nm. Herein, to transmit emission, either one of an anode or a cathode of an organic EL element is preferably transparent or translucent to improve the mission luminance.

A cathode is generally formed as a reflective electrode; the above-described metal is prepared in a layer thickness of 1-20 nm as a cathode followed by formation of a conductive transparent material, which is listed in the explanation of an anode, whereby a transparent or translucent cathode can be prepared; and an element provided with transparency of both of an anode and a cathode can be prepared.

Further, a bottom emission type organic EL element having an opposite layer structure can be prepared by forming an anode with a reflective electrode comprising such as gold to prepare a translucent cathode.

Next, organic layers (an injection layer, an inhibition layer and electron transport layer) in an organic EL element of this invention will be explained.

<Injection Layer: Electron Injection Layer, Positive Hole Injection Layer>

An injection layer is appropriately provided and includes an electron injection layer and a positive hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide: The above-described buffer layer (injection layer) is preferably a very thin layer, and the layer thickness is preferably in a range of 0.1 nm-5 μm although it depends on a raw material.

<Inhibition Layer: Electron Inhibition Layer, Positive Hole Inhibition Layer>

An inhibition layer is, as described above, provided according to need beside basic constitution layers of organic thin layers. As a positive hole inhibition layer, for example, a positive inhibition layer described in such as JP-A Nos. 11-204258 and 11-204359 and p. 237 of "Organic EL Elements and Industrialization Front Thereof (Nov. 30 (1998), published by N. T. Corp.)" is applicable to a positive hole inhibition (hole block) layer according to this invention.

A positive hole inhibition layer, in a broad meaning, is provided with a function of electron transport layer, being comprised of a positive hole inhibition material having a function of transporting an electron but a very small ability of transporting a positive hole, and can improve the recombination probability of an electron and a positive hole by inhibiting a positive hole while transporting an electron. Further, a constitution of an electron transport layer described later can be appropriately utilized as a positive hole inhibition layer according to this invention.

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, a constitution of a positive hole transport layer described later can be appropriately utilized as an electron inhibition layer.

<Emission Layer>

An emission layer according to this invention is a layer to emits light by recombination of an electron and a hole which are injected from an electrode, an electron transport layer or a hole transport layer, and the portion to emit light may be either the inside of an emission layer or the interface between an emission layer and the adjacent layer.

An organic EL panel according to this invention preferably contains a host compound and a dopant compound which will be described in the following. It is possible to further increase emission efficiency thereby.

A fluorescent dopant is roughly classified into a fluorescent dopant which emits fluorescence and a phosphorescent dopant which emits phosphorescence.

A typical example of the former (a fluorescent dopant) includes coumarin type dye, pyran type dye, cyanine type dye, croconium type dye, squarylium type dye, oxobenzanthracene type dye, fluorescein type dye, rhodamine type dye, pyrylium type dye, perylene type dye, stilbene type dye, polythiophene type dye or rare earth complex type fluorescent substances.

A typical example of the latter (a phosphorescent dopant) is preferably a complex type compound containing metal of the 8th-10th groups of the periodic table, more preferably an iridium compound and an osmium compound and most preferable among them is an iridium compound. Specifically, listed are compounds described in the following patent publication.

The phosphorescent dopant of the present invention is a compound wherein emission from an excited triplet state thereof is observed, specifically including a compound emitting phosphorescence at room temperature (25° C.), which is defined as a compound exhibiting a phosphorescence quantum efficiency of at least 0.01 at 25° C. However, the phosphorescence quantum efficiency is preferably at least 0.1.

Such as WO 00/70655, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645, JP-A Nos. 2002-332291, 2002-50484, 2002-332292 and 2002-83684, Japanese Translation of PCT International Application Publication No. 2002-540572, JP-A Nos. 2002-117978, 2002-338588, 2002-170684 and 2002-352960, WO 01/93642 pamphlet, JP-A Nos. 2002-50483, 2002-100476, 2002-173674, 2002-359082, 2002-175884, 2002-363552, 2002-184582 and 2003-7469, Japanese Translation of PCT International Application Publication No. 2002-525808, JP-A 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

A part of examples are shown below.

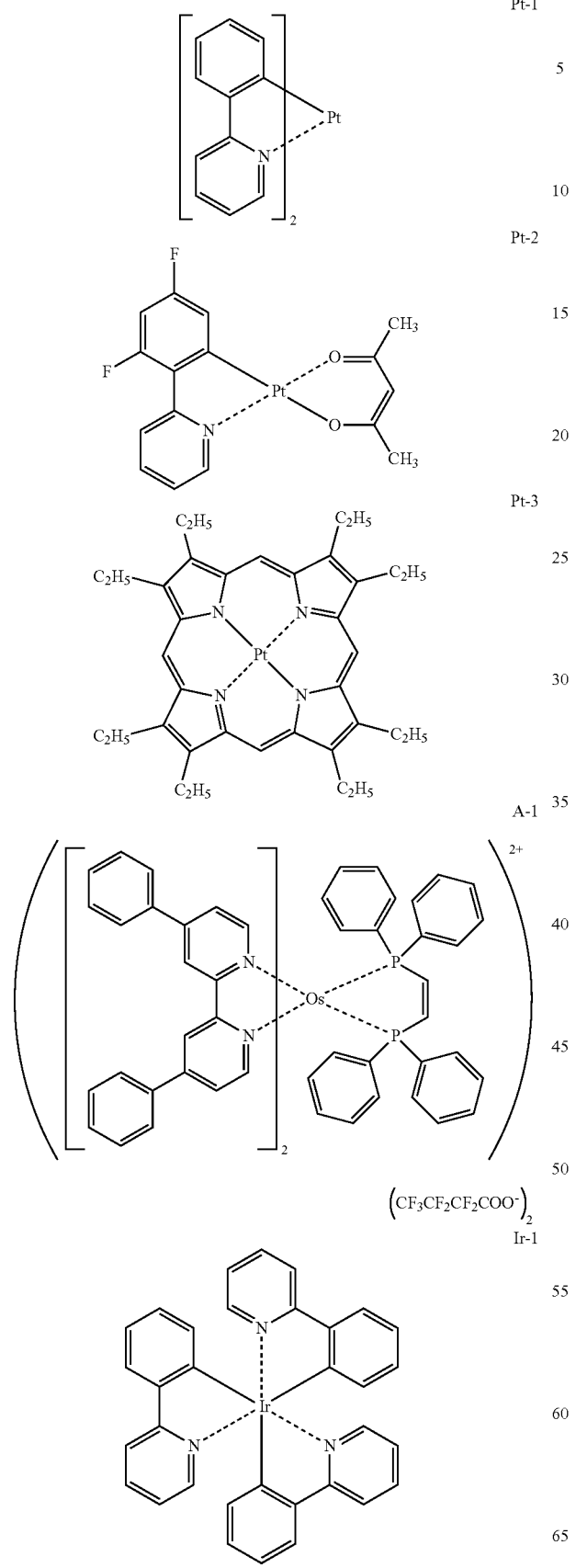
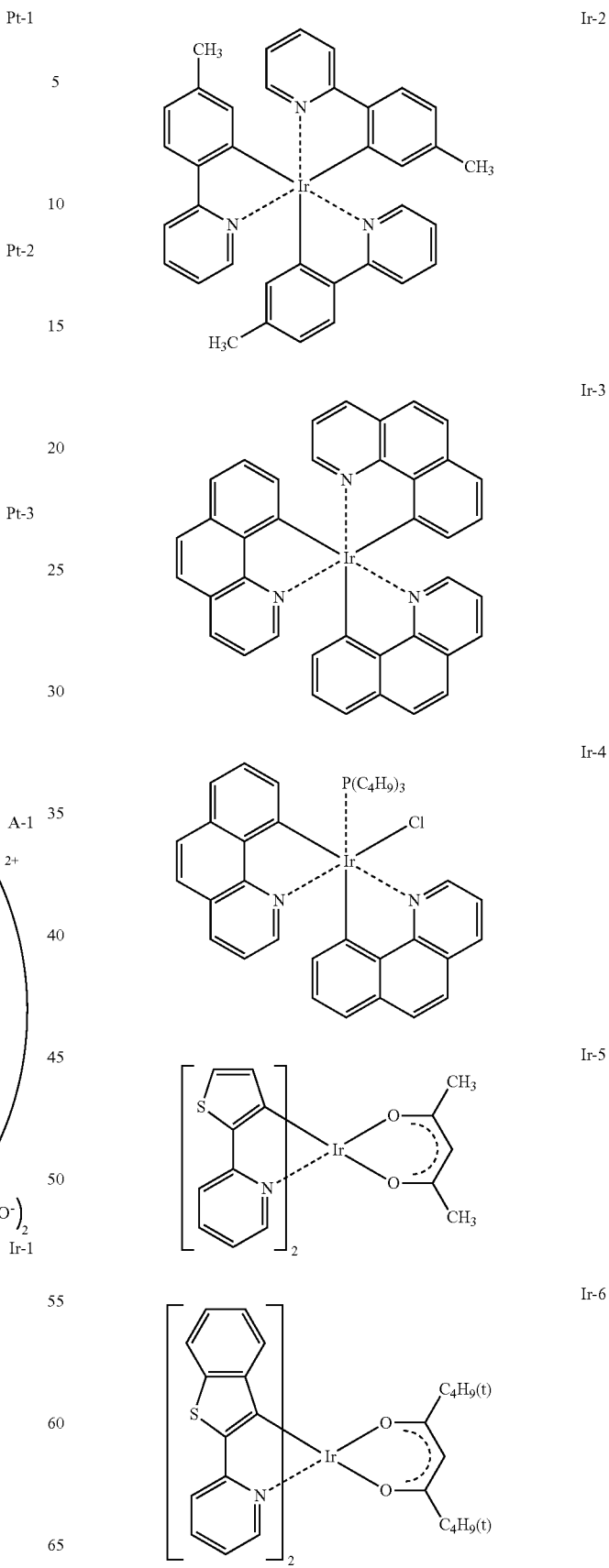

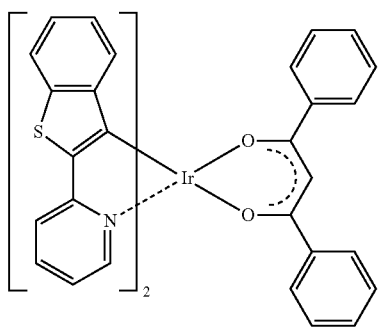
Ir-7

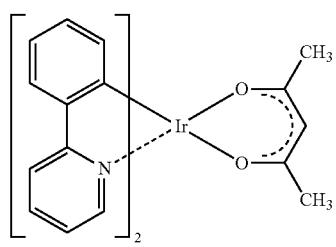
Ir-8

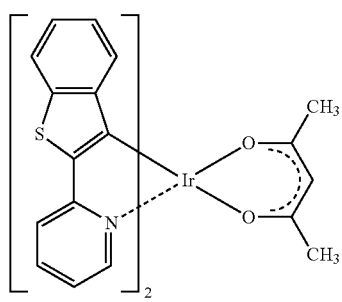
Ir-9

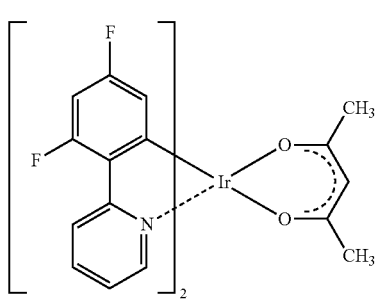
Ir-10

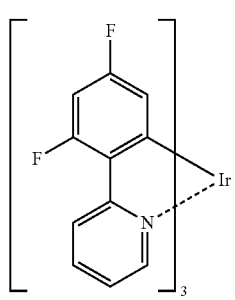
Ir-11

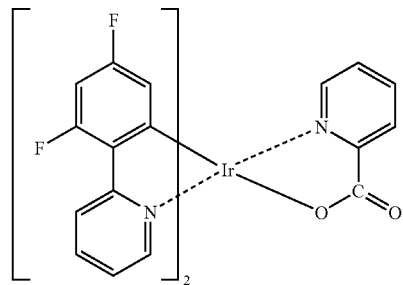
Ir-12

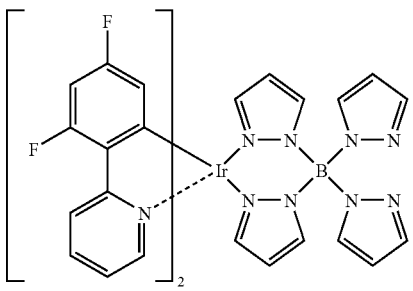
Ir-13

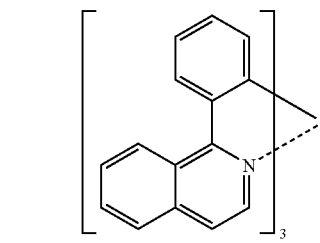
Ir-14

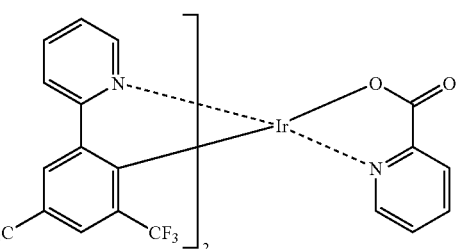
Ir-15

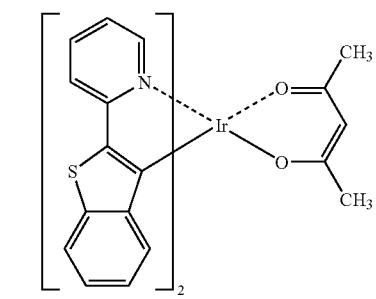
Ir-16

A mixture of a plurality of emission dopants may be used.

<Host Compound (Emission Host Compound, or Also Referred to Simply as Host)>

The host compound of the present invention refers to a compound exhibiting a phosphorescence quantum yield of less than 0.01 during phosphorescence emission at room temperature (25° C.).

An emission host (an emission compound) used in the present invention is not specifically limited in terms of the structure, typically including a carbazole derivative, a triarylamine derivative, an aromatic borane derivative, nitrogen-containing heterocyclic derivative, a thiophene derivative, a furan derivative, a compound having a basic skeleton such as an oligoaryrene compound, a carboline derivative or a diazacarbazole derivative (a diazacarbazole derivative indicates a derivative having a ring structure wherein at least one of the carbon atoms of a hydrocarbon ring constituting a carboline derivative is substituted with a nitrogen atom).

Of these, it is preferable to use a carboline derivative or a diazacarbazole derivative.

Specific examples of a carboline derivative or a diazacarbazole derivative are shown below. However, the present invention is not limited to them.

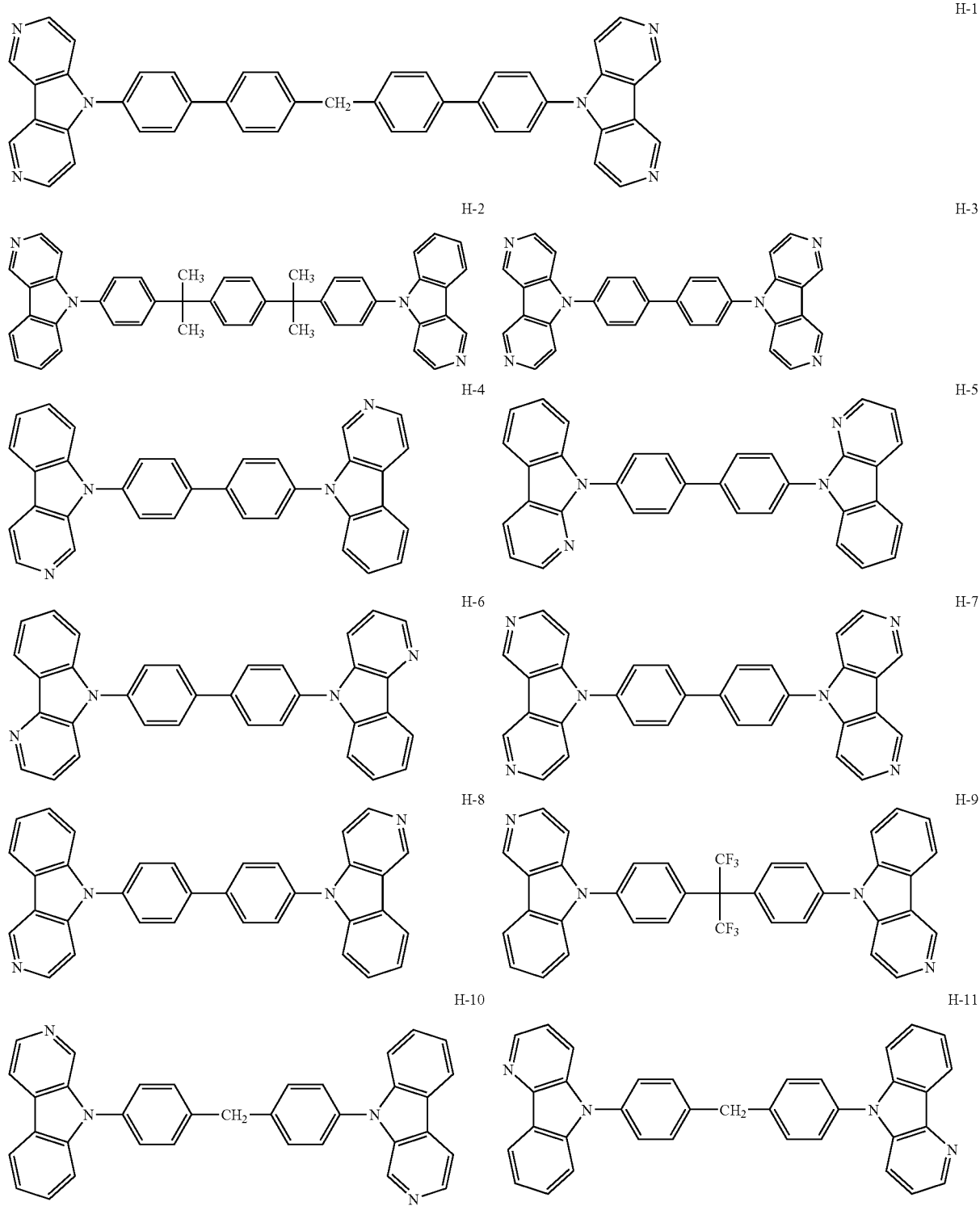

-continued

H-12
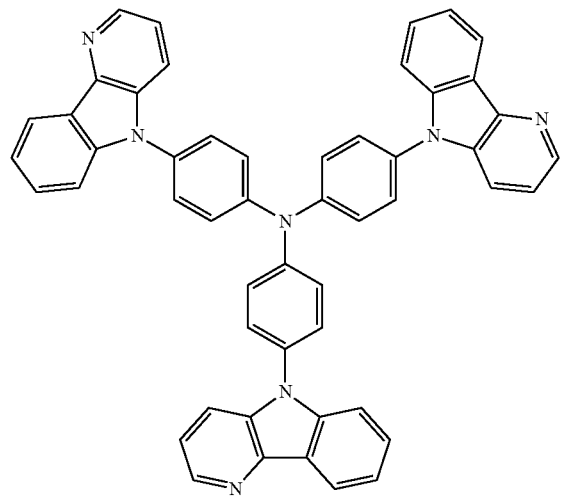

H-13
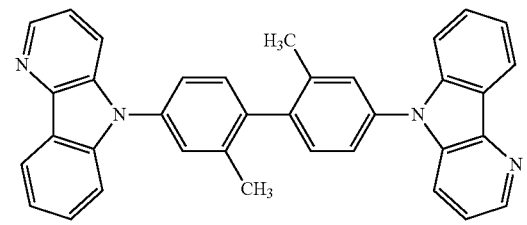

H-14
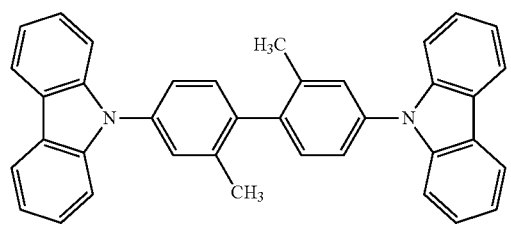

H-15
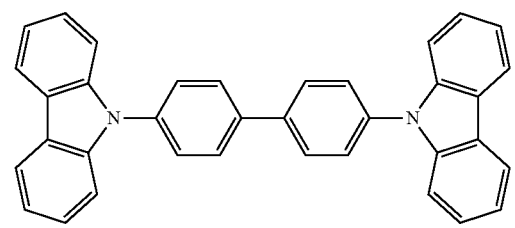

Further, an emission host of this invention may be either a low molecular weight compound or a polymer compound having a repeating unit, in addition to a low molecular weight compound provided with a polymerizing group such as a vinyl group and an epoxy group (an evaporation polymerizing emission host).

An emission host is preferably a compound having a positive hole transporting ability and an electron transporting ability, as well as preventing elongation of an emission wavelength and having a high Tg (a glass transition temperature). As specific examples of an emission host compounds described in the following Documents are preferable: For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Further, plural types of host compounds well known in the art may be utilized in combination. Further, by utilizing plural types of dopant compounds, it is possible to mix different emitting lights to obtain an arbitrary emission color. White emission is possible by adjusting a type of a phosphorescent compound and the doping amount, and is applicable for a white illumination and a backlight by means of segment display.

Color emitted by an organic EL element of this invention is determined by color, which is a measured result by a spectral radiation luminance meter CS-1000 (manufactured by Konicaminolta Sensing Co., Ltd.) being applied to CIE chromaticity coordinate, which is described in FIG. 4.16 of p. 108, "New Edition of Color Science Handbook" (edited by Japan Color Association, published University of Tokyo Press, 1985).

An emission layer can be prepared by film formation of the above-described compound by means of a thin film forming method well known in the art such as a vacuum evaporation method, a spin-coat method, a cast method, a LB method and an inkjet method. A layer thickness as an emission layer is not specifically limited; however, is generally selected in a range of 6 nm-5 μm and preferably of 5-200 nm. This emission layer may have a single layer structure comprising one type or not less than two types of these phosphorescent compounds and host compounds or may have an accumulated structure comprising plural layers of an identical composition or different compositions.

<Positive Hole Transport Layer>

A positive hole transport layer contains a positive hole transporting material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N, N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N, N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N, N',N'-tetraphenyl-4,4'-diaminophenylether; 4,4'-bis(diphenylamino)quarterphenyl; N,N, N-trip-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N, N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4', 4"-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized. Further, an inorganic compound such as a p type-Si and a p type-SiC can be utilized as a positive hole injection material and a positive hole transport material This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, is generally 5 nm-5 µm, more preferably 5 nm-200 nm. This positive transport layer may have a single layer structure comprised of one or not less than two types of the above described materials.

A positive hole transporting layer having a high p property in which is doped with an impurity may be used Examples of them are described in JP-A 4-297076, JP-A 2000-196140; JP-A 2001-102175 and J, Appl. Phys., 95, 5773 (2004).

<Electron Transport Layer>

An electron transfer layer is comprised of a material having a function to transfer an electron, and an electron injection layer and a positive hole inhibition layer are included in an electron transfer layer in a broad meaning. A single layer or plural layers of an electron transfer layer may be provided.

Conventionally, as an electron transfer material utilized in a single layer of an electron transfer layer, and in an electron transfer layer adjacent to the cathode side against an emission layer in the case of utilizing plural electron transfer layers, the following materials are known.

An electron transfer material (including a positive hole inhibition material) is provided with a function to transmit an electron injected from a cathode to an emission layer, and compounds conventionally well known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SIC can be also utilized as an electron transfer material.

This electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, is generally 5 nm-5 µm, and more preferably it is 5-200 nm. This electron transport layer may have a single layer structure comprised of one or not less than two types of the above described materials.

An electron transporting layer having a high n property in which is doped with an impurity may be used. Examples of them are described in JP-A 4-297076, JP-A 2000-196140, JP-A 2001-102175 and J, Appl. Phys., 95, 5773 (2004).

<Substrate (Also Referred to as Base Plate, Base Material or Support)>

Examples of a substrate according to an organic EL element of this invention includes glass, quartz and transparent resin film. Resin films include such as film comprised of polyethylene terephthalate (PET), polyethylene naphthalate (PEN), polyether sulphone (PES), polyether imide, polyether etherketone, polyphenylene sulfide, polyallylate, polyimide, polycarbonate (PC) and cellulose acetate propionate (CAP).

On the surface of resin film, an inorganic (e.g., silicon oxide, silicon nitride oxide) or organic cover layer or a hybrid cover layer comprising the both may be formed, and the film is preferably provided with a high barrier ability having a vapor transmittance of not more than 0.01 g/(m²·day·atm).

An organic'EL panel can be made by forming sequentially the above-described constitution layers on a substrate.

First, on an appropriate substrate such as glass plate, a thin layer comprising a desired electrode substance such as an anode electrode substance is formed by means of evaporation or spattering so as to make a layer thickness of not more than 1 µm and preferably of 10 nm-200 nm, whereby an anode is prepared.

Next, on this layer, thin layers containing organic substances (e.g., hole injection layer, a positive hole transport layer, an emission layer, and an electron transport layer, an electron injection layer, and a positive hole inhibition layer) are formed. A thin layer forming method of these layers containing the organic substances includes such as a vacuum evaporation method, a spin coat method, an ink-jet method, and a printing method. Further, a different layer forming method depending on each layer may be applied. In the case of employing an evaporation method in layer formation, the evaporation condition depends on such as the type of a utilized compound, however, is generally appropriately selected in a range of 50-450° C. as a boat heating temperature, $10^{-6}$-$10^{-2}$ Pa as a vacuum degree, 0.01-50 nm/sec as a deposition rate, −50-300° C. as a substrate temperature and 0.1 nm-5 μm, more preferably 5 nm-200 nm as a layer thickness.

After formation of these layers, a thin layer comprising a cathode electrode substance is formed thereon by means of such as evaporation or spattering so as to make a layer thickness in a range of 50-200 nm to provide a cathode, whereby a desired organic EL element can be, prepared. This preparation of an organic EL element is preferably carried out with one time evacuation to prepare all through from a positive hole injection layer to a cathode, however, different layer forming method may be also applied by taking out the element on the way. At that time, it is preferable to take consideration such as to perform the operation under a dry inert gas environment. At this time, it is not preferable to make the layer thickness of not more than 50 nm because reflectivity is decreased to lower emission efficiency and to deteriorate sealing ability. To make the layer thickness of a cathode large is preferable with respect to sealing ability; however, it is not preferable to make the layer thickness of not less than 200 nm because a problem of stress will be generated.

Further, reversing the preparation order, it is also possible to prepare an organic EL element in the order of a cathode, an electron injection layer, an electron transport layer, an emission layer, a hole transport layer, a hole injection layer and an anode. In the case of applying direct voltage on a multicolor display apparatus thus prepared, emission can be observed when a voltage of approximately 2-40 V is applied utilizing an anode as + and a cathode as −. Further, alternating voltage may be also applied. Herein, the wave-form of alternating voltage applied may be any form.

EXAMPLES

In the following, with respect to preparation of an organic EL element according to this invention, a preferable embodiment will be explained.

A constitution of an organic EL element will be explained in reference to FIG. 5.

Example 1

Preparation of a white emitting organic EL Panel of a segment display type, which utilizes a glass plate as a substrate and has a constitution comprising an anode (a transparent electrode), organic layers (an example provided with a hole injection layer/a hole transport layer/an emission layer/an electron transport layer/an electron injection layer as organic layers will be explained) and a cathode on said glass plate, as an example of an organic EL element will be explained in reference to FIGS. 5 (a) and (b).

First, utilizing a substrate (NA45 manufactured by NH Technoglass Corp.), comprising substrate 1 (a glass plate) having a size of 100 mm×100 mm×1.1 mm (thickness) on which ITO (indium tin oxide) having been deposited, the ITO film was patterned by means of photolithography employing resist. That is, after the portion other than a non-conductive region had been covered with resist, ITO film of the non-conductive region (the exposed portion) was removed by being immersed into a 25% hydrochloric acid aqueous solution. Thereafter, resist was removed by immersion into a 1.5% sodium hydroxide aqueous solution, followed by further washing and drying.

A pattern or anode 2 (a transparent electrode) comprising ITO, which will be a display part having a size of 40 mm×40 mm, was formed at the center of a glass plate having a size of 100 mm×100 mm (refer to FIG. (a) and (b)).

Next, the circumference of substrate 1 (a glass plate), on which a pattern of anode 2 (a transparent electrode) had been formed, was covered with a mask, and each organic layer constituting an organic EL element was formed by vacuum evaporation so as to cover anode 2 (refer to FIG. 5(a) and (b)).

Organic layer 3 and organic layer 3a each were formed on the region covering the region of 60 mm×60 mm which covers anode 2 (a transparent electrode) arranged at the center of substrate 1.

Herein, formation of each of organic layer 3 (such as a hole injection layer, a hole transport layer, an emission layer, an electron transport layer and an electron injection layer) and organic layer 3a (the layer thickness is different from organic layer 3, however, the layer structure is the same) was conducted by employing a vacuum evaporation method in the following manner.

Substrate 1 (a glass plate), on which an ITO transparent electrode pattern had been formed as anode 2 (a transparent electrode), was covered with a mask and fixed on a substrate holder of a vacuum evaporation system available on the market to successively form organic layers in the following manner.

First, after a vacuum chamber had been evacuated down to $4 \times 10^{-4}$ Pa, a resistance heating boat made of tantalum and containing m-MTDATXA was applied with current and evaporation at an deposition rate of 0.1 nm/sec was conducted to form a hole transport layer having a thickness of 40 nm.

Thereafter, emission layers each were formed by accumulation in the following constitution utilizing each composition of emission layer A or intermediate layers 1 and 2.

A resistance heating boat made of tantalum was charged with each of a host compound and a dopant so as to make the following ratio and being heated by applying current, whereby each emission layer was formed so as to have the described thickness by evaporation at a deposition rate of 0.1 nm/sec.

Emission layer A: CDBP:Ir-15 (3%): layer thickness (25 nm)
    Intermediate layer 1: L-98: layer thickness (3 nm)
    Emission layer B: CDBP:Ir-16 (8%): layer thickness (10 nm)

Herein, CDBP:Ir-15 (3%): layer thickness (25 nm) in each emission layer indicates a deposited film having a thickness of 25 nm containing 3 weight % of Ir-15, which is a dopant, against CDBP.

Next, L-98 was deposited in 10 nm thickness thereon as a hole inhibition layer.

Further, a heating boat filled with $Alq_3$ was heated with electric current to provide an electron transport layer having a layer thickness of 35 nm on the aforesaid hole inhibition layer at a deposition rate of 0.1 nm/sec. However, a deposition thickness on the portion of 3a in FIG. 7(a) was further increased to form an electron transport layer having a thickness of 100 nm. Herein, evaporation was conducted at a substrate temperature of room temperature. Successively, 0.5 nm of lithium fluoride was deposited as a cathode buffer layer (an electron injection layer).

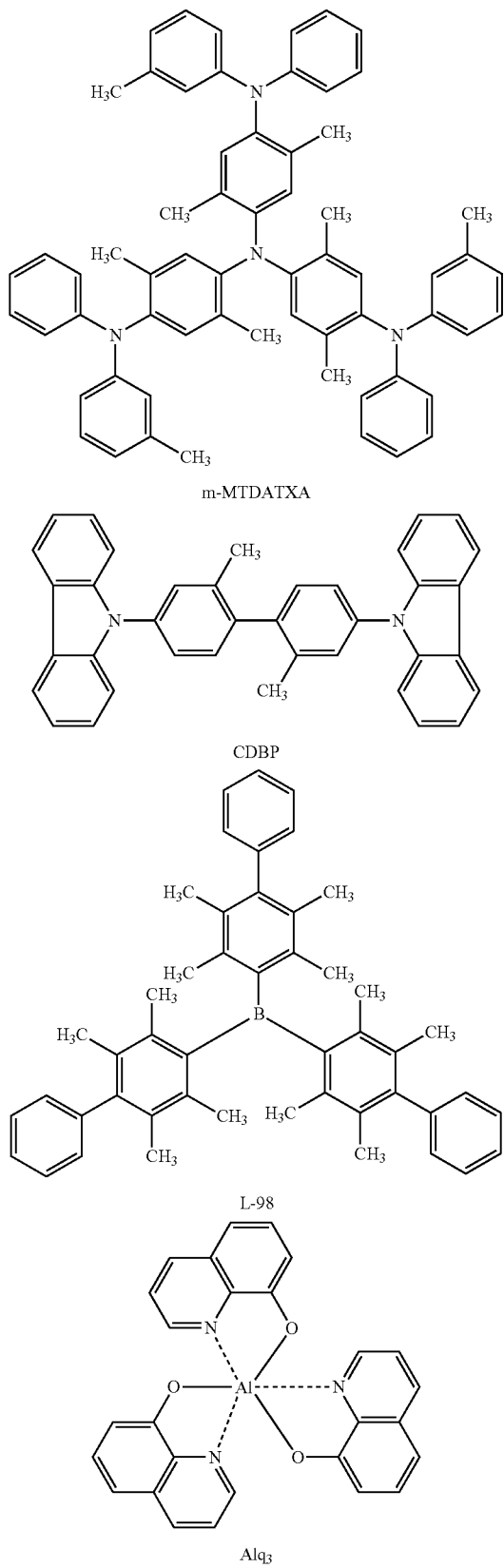

m-MTDATXA

CDBP

L-98

Alq₃

Then, by use of the same vacuum evaporation system, 110 nm of aluminum was deposited so as to cover organic layer 3 also utilizing a mask, whereby cathode 4 (a reflective electrode) was formed. Cathode 4 (a reflective electrode) is comprised of a region of 80 mm×80 mm at the center of substrate 1.

In the above manner, an organic EL panel of this invention has been prepared. Thereby, prepared can be a white light emitting organic EL panel which has a constitution to cover a main emission area by cathode 4 (a reflective electrode) in the circumference length of an emission area and has no edge portion of cathode 4 (a reflective electrode) where an emission function will be damaged.

FIG. 5(*b*) is a drawing to show an emission area viewed from the side of substrate 1; an area (also referred to as a region) of 40 mm×40 mm, where anode 2 (a transparent electrode) and cathode 4 (a reflective electrode) overlap each other and thick portion 3*a* of an organic layer is excluded, is main emission area 8.

Example 2

An organic EL panel was prepared in a similar manner to example 1, except that layer thickness of an electron transport layer formed on the portion of area 3*a* was set to 50 nm.

Example 3

Another embodiment will now be explained with reference to FIG. 6. An organic EL panel was prepared in a similar manner to example 1. An organic layer was prepared in a similar constitution to organic layer 3 of example 1, except that an electron injection layer was formed only on the area (area of 50 mm×60 mm) (3(*b*) of FIG. 6) other than the corresponding portion to an area of 10 mm×60 mm (3(*a*) of FIG. 5) which is same as organic layer area 3*a* of example 1. Preparation other than formation of an electron injection layer was conducted in a similar manner to example 1.

Example 4

Another embodiment will now be explained with reference to FIG. 7. An organic EL panel was prepared in a similar manner to example 1. An area of 50 mm×60 mm (2(*b*) of FIG. 7), which is same as organic layer area 3, was subjected to a plasma treatment while masking the portion corresponding to an area of 10 mm×60 mm (2(*a*) of FIG. 5) which is same as organic layer 3*a* of example 1. Thereafter, an organic layer was formed including an area which had not been subjected to a plasma treatment. An organic layer was formed in a same constitution as organic layer area 3 of example 1. Preparation was conducted in a similar manner to example 1 except the plasma treatment.

Comparative Example

Figure 8:
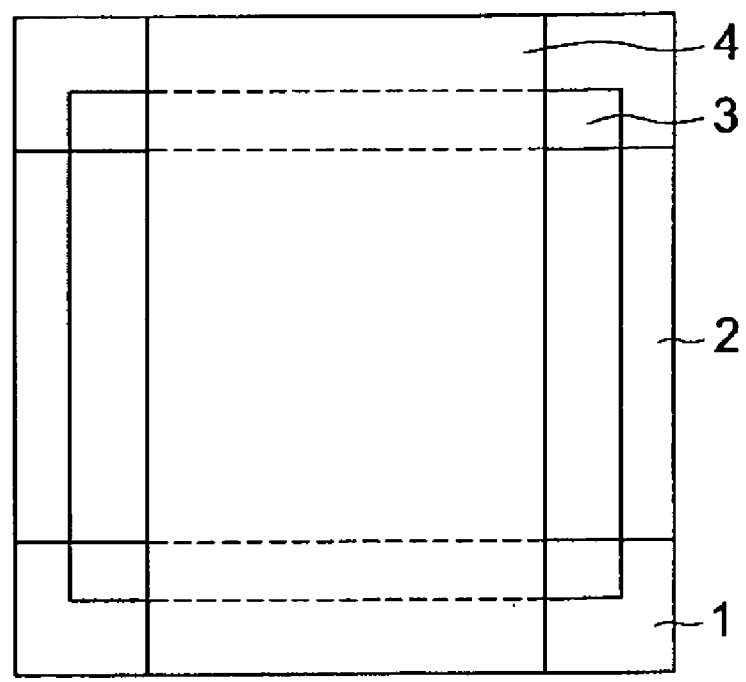
FIG. 8 is a schematic drawing to show an example of an electrode structure of an organic EL panel conventionally known.
Figure 8:
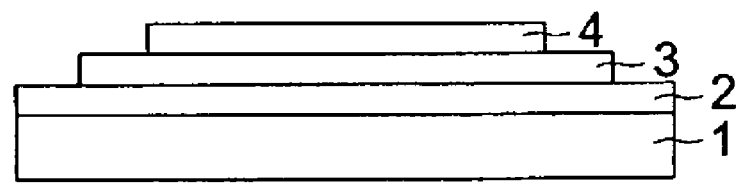

A comparative example will now be explained with reference to FIG. 8. Anode 2 having a stripe form of 60 mm×10 mm was formed by patterning an ITO substrate of 100 mm×100 mm as shown in FIG. 8 (*a*). Next, an organic layer was formed in a constitution similar to organic layer 3 of example 1 on an area of 80 mm×80 mm at the center of the substrate. Then, a cathode was formed in a stripe form of 100 mm×60 mm as shown in FIG. 8 (*a*).

After continuous drive for 1,000 hours of these panels at a constant current to make an initial luminance of 1,000 cd/m², loss of the emission area (reduction of an emission area) was observed; the results will be shown in the following table.

TABLE 1

|  | State of emission at edge portion of cathode area | Loss of emission area (reduction) |
|---|---|---|
| Example 1 | Non-emission | Non |
| Example 2 | Low-emission | Small |
| Example 3 | Low-emission | Small |
| Example 4 | Low-emission | Small |
| Comparative example | Emission | Large |

It has been proved from these results that there caused no loss of an emission area of a panel in a state that the edge portion of a cathode area does not emit light. Further, it has been proved that there caused little loss of an emission area of a panel in a state that the edge portion of a cathode area emits with a low luminance.

An organic EL panel of this invention can be utilized in such as a home use illumination, a car illumination, a backlight for a watch and a liquid crystal, an advertising sign board, a signal tower, a light source for a memory medium, a light source for electrophotographic copier, a light source for an optical processor and a light source for an optical sensor; however, the application is not limited thereto.

An organic EL element of this invention can be applied for a display apparatus such as a display device, a display and various emission light sources. In a display, full color display is possible by employing three types, or blue, red and green emitting organic EL elements. A display device and a display include such as a television, a personal computer, a mobile apparatus, an AV apparatus, a character broadcast display and information display in a car. In particular, organic EL of this invention may be utilized as a display apparatus to regenerate a still image or a dynamic image, and a drive method in the case of utilizing as a display device for dynamic image reproduction may be a simple matrix (passive matrix) method.

The invention claimed is:

1. A bottom emission type organic electroluminescent panel equipped with an electroluminescent element comprising an anode and a cathode on a substrate and at least one organic layer between the anode and the cathode,
    wherein the electroluminescent panel comprises:
        a main emission area emitting light with a high luminance;
        a low emission area emitting light with a relatively lower luminance than the high luminescence of the main emission area, the low emission area being located outside an edge portion of the main emission area,
    wherein the anode extends outside of the main emission area on a same side of the substrate as the electroluminescent element to form an anode take-out part, the anode take-out part not being superposed by a portion of the cathode, and
    wherein an edge portion of a cathode forming area is arranged outside the edge portion of the main light emission area by limiting the main emission area to a smaller size than the cathode forming area,
    wherein the organic layer has an uncovered area which overlaps with a part of the anode take-out part, the area having a larger layer thickness of the organic layer than another part of the organic layer that is in the main emission area; and
    wherein a part of the cathode is formed so as to overlap on at least a part of the area having a larger layer thickness.

2. The bottom emission type organic electroluminescent panel of claim 1,
    wherein an emitted light is a white light.

* * * * *